(12) United States Patent
Paseman et al.

(10) Patent No.: US 10,681,843 B2
(45) Date of Patent: Jun. 9, 2020

(54) ELECTRONIC DEVICES HAVING ADAPTIVE SURFACES

(71) Applicant: Apple Inc., Cupertino, CA (US)

(72) Inventors: Sabrina K. Paseman, Saratoga, CA (US); Timothy P. M. Johnson, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/027,152

(22) Filed: Jul. 3, 2018

(65) Prior Publication Data

US 2019/0104645 A1    Apr. 4, 2019

Related U.S. Application Data

(60) Provisional application No. 62/565,883, filed on Sep. 29, 2017.

(51) Int. Cl.
| | |
|---|---|
| H05K 7/00 | (2006.01) |
| H05K 7/20 | (2006.01) |
| A45C 11/00 | (2006.01) |
| G06F 1/20 | (2006.01) |
| H04B 1/3827 | (2015.01) |
| G06F 1/16 | (2006.01) |

(52) U.S. Cl.
CPC .......... *H05K 7/20427* (2013.01); *A45C 11/00* (2013.01); *G06F 1/203* (2013.01); *G06F 1/206* (2013.01); *A45C 2011/002* (2013.01); *A45C 2011/003* (2013.01); *G06F 1/1616* (2013.01); *G06F 2200/201* (2013.01); *H04B 1/3827* (2013.01)

(58) Field of Classification Search
None
See application file for complete search history.

(56) References Cited

U.S. PATENT DOCUMENTS

| | | | |
|---|---|---|---|
| 9,515,025 B2 * | 12/2016 | Rogers | H01L 27/1266 |
| 10,234,960 B1 * | 3/2019 | Bharadwaj | G06F 3/0216 |
| 2006/0202492 A1 * | 9/2006 | Barvosa-Carter | |
| | | | B60N 2/42709 |
| | | | 293/107 |
| 2008/0157235 A1 * | 7/2008 | Rogers | H01L 21/8258 |
| | | | 257/415 |
| 2010/0002402 A1 * | 1/2010 | Rogers | H01L 21/4867 |
| | | | 361/749 |
| 2013/0176628 A1 * | 7/2013 | Batchko | G02B 3/12 |
| | | | 359/665 |
| 2015/0373831 A1 * | 12/2015 | Rogers | H01L 23/18 |
| | | | 429/121 |
| 2016/0103545 A1 * | 4/2016 | Filiz | G01L 1/18 |
| 2016/0136877 A1 * | 5/2016 | Rogers | B29C 61/0616 |
| | | | 428/174 |
| 2017/0242506 A1 * | 8/2017 | Patel | G06F 3/044 |

(Continued)

*Primary Examiner* — Courtney L Smith
*Assistant Examiner* — Rashen E Morrison
(74) *Attorney, Agent, or Firm* — Morgan, Lewis & Bockius LLP

(57) ABSTRACT

Aspects of the subject technology relate to electronic devices having adaptive surfaces. An adaptive surface may expand or deform responsive to a temperature change and/or a mechanical strain for thermal management for the device or for mechanical restructuring of the device in various configurations. The adaptive surface may be formed from a negative Poisson's ratio relief pattern in the surface or an inhomogeneous arrangement of materials.

19 Claims, 7 Drawing Sheets

(56) References Cited

U.S. PATENT DOCUMENTS

| | | | |
|---|---|---|---|
| 2017/0285864 A1* | 10/2017 | Pedder | G01L 1/18 |
| 2017/0357325 A1* | 12/2017 | Yang | G06F 3/016 |
| 2018/0052491 A1* | 2/2018 | Kapinos | G06F 1/1637 |
| 2018/0059839 A1* | 3/2018 | Kim | H01L 51/5284 |
| 2018/0194106 A1* | 7/2018 | Tibbits | B32B 7/02 |
| 2018/0217639 A1* | 8/2018 | Jones | G06F 1/1652 |

* cited by examiner

ELECTRONIC DEVICES HAVING ADAPTIVE SURFACES

CROSS-REFERENCE TO RELATED APPLICATIONS

The present application claims the benefit of U.S. Provisional Patent Application Ser. No. 62/565,883, entitled "ELECTRONIC DEVICES HAVING ADAPTIVE SURFACES" filed on Sep. 29, 2017, which is hereby incorporated by reference in its entirety for all purposes.

TECHNICAL FIELD

The present description relates generally to electronic devices, and more particularly, but not exclusively, to electronic devices with housings having adaptive surfaces.

BACKGROUND

Electronic devices such as mobile phones, portable music players, smart watches, tablet computers, laptop computers, desktop computers, televisions, and servers are provided with electronic components disposed within a housing. Rigid housings typically provide mechanical support for the device and protection for the internal electronic components. However, challenges can arise when attempting to provide thermal management and desired structural features with a single rigid housing.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

In accordance with various aspects of the subject disclosure, electronic devices are provided with a housing having an adaptive surface. The adaptive surfaces are deformable from a first configuration to at least a second configuration responsive to a temperature change such as a temperature change caused by heat generated by an electronic component within the housing, or responsive to a mechanical strain on the surface. For example, heat from a processor within the device housing can cause direct thermal expansion of an adaptive surface formed from a shape-memory material, or can cause indirect thermal expansion of the adaptive surface via thermal expansion of a support structure for the adaptive surface in a first direction that causes a mechanical expansion of the adaptive surface in the first direction. The indirect thermal expansion of the adaptive surface in the first direction can, in turn, cause the deformation in at least a second direction.

The adaptive surface can be formed from multiple materials having different coefficients of thermal expansion or can be formed from a negative Poisson's ratio relief pattern formed in the surface. The adaptive surface may be formed from a shape memory material that holds the second configuration until the temperature of the adaptive surface falls below a threshold, and then returns to the first configuration in a bi-stable manner. In other implementations, the adaptive surface can smoothly deform between the first and second configurations in connection with temperature changes (e.g., a temperature rise or a temperature fall) at or near the surface and/or in connection with a mechanical strain on the surface.

Figures 1A, 1B:
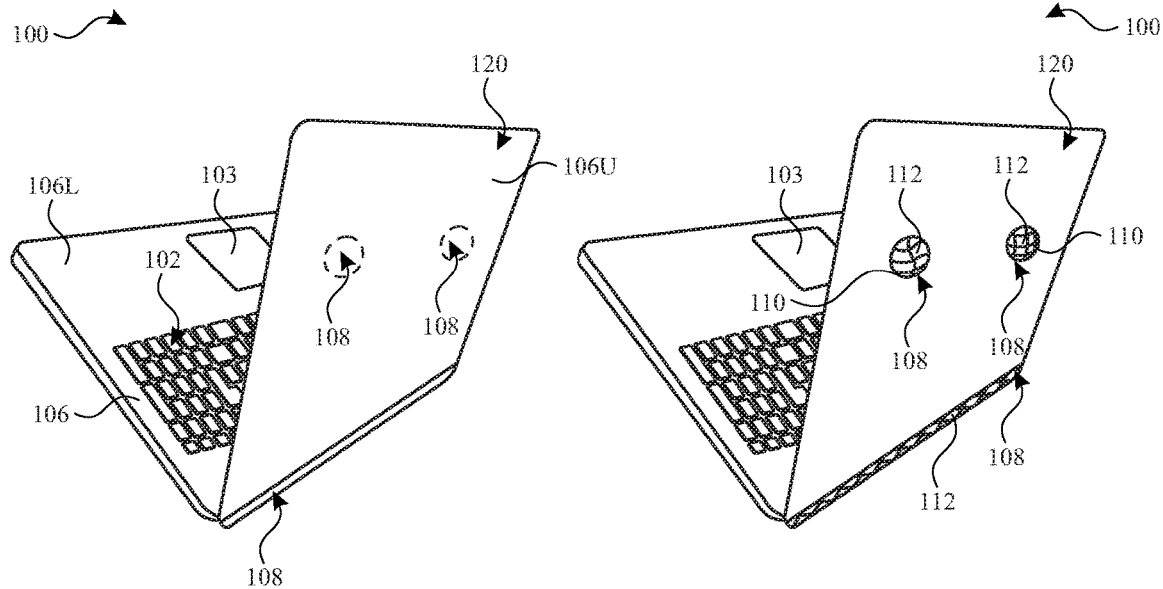
FIGS. 1A and 1B illustrate perspective views of an example electronic device having a housing with an adaptive surface before and after expansion of the adaptive surface in accordance with various aspects of the subject technology.

An illustrative electronic device having an adaptive surface is shown in FIG. 1A. In the example of FIG. 1A, device 100 has been implemented in the form of a portable computer such as a laptop computer. As shown in FIG. 1A, device 100 may include keyboard 102, housing 106, and a touch pad such as touch pad 103. Although not visible in the perspective view of FIG. 1A, it should be understood that device 100 may include a display such as a liquid crystal display (LCD) or an organic light-emitting diode (OLED) display.

In the perspective views of FIG. 1A, the rear surface of upper portion 106U of housing 106 is visible. Upper portion 106U is rotatably coupled to bottom housing 106L in which keyboard 102 and touch pad 103 are disposed. In the example of FIG. 1A, upper housing 106 includes an adaptive surface 120 having a plurality of adaptive regions 108. Although discrete regions 108 are shown in FIG. 1A, it should be appreciated that, if desired, the entire surface of upper housing 106U and/or some or all of lower housing 106L may be adaptive.

The adaptive surfaces 108 of housing 106 can transition from a first configuration (e.g., as shown in FIG. 1A in which the surface of upper housing 106U is a planar or otherwise continuously curved surface) to a second configuration (e.g., as shown in FIG. 1B in which the adaptive surfaces form bulges or domes 110 on the surface of upper housing 106U).

As shown in FIG. 1B, bulges or domes 110 formed in adaptive regions 108 may include openings 112 that allow airflow into and/or out of housing 106. In this way, the bulging of some or all of housing 106 during operation of device 100 may allow heat to escape through openings 112, thereby enhancing the thermal management for device 100. Bulges 110 may form (and openings 112 may be generated) in housing 106 responsive to heat changes within the housing (e.g., by an operating electronic component such as a microprocessor or a battery) and/or responsive to a mechanical strain on a portion of the housing and may relax to the configuration of FIG. 1A when the heat is removed. In one example, the adaptive surfaces may be patterned sheets of material that are coupled to a stiffer material with a large coefficient of thermal expansion (CTE) such that, when the temperature of the stiffer material changes (e.g., the stiffer material is heated due to the heat from the operating electronic component) the stiffer material expands in a desired direction to drive the expansion of the patterned material. In another example, the patterned sheet of material may be a patterned shape-memory material that deforms from a first configuration to a second configuration in response to an application or a removal of heat generated within the housing. In this way, device 100 may be provided with a "breathing" enclosure that expels heat through newly generated openings when needed and closes those openings when the heat within the device has been dissipated.

Figures 2A, 2B:
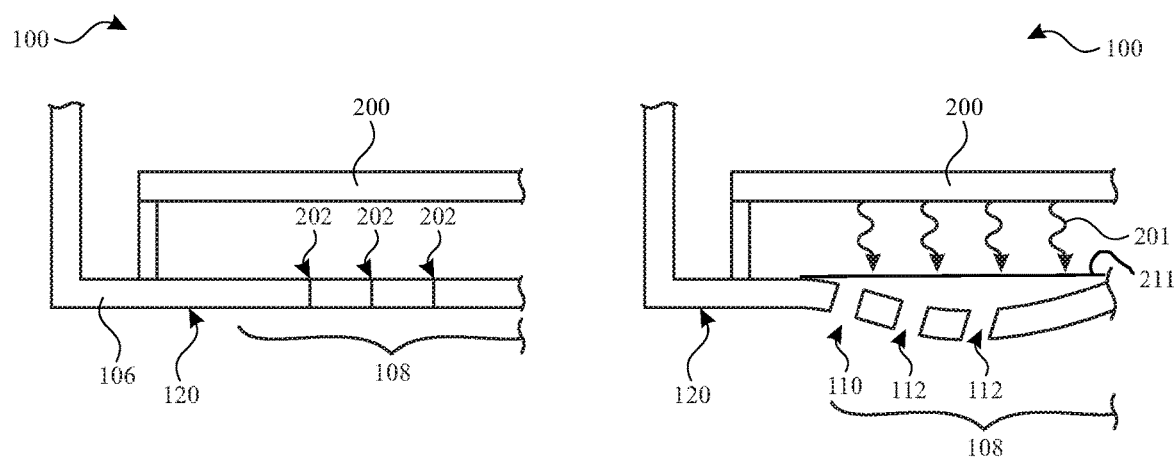
FIGS. 2A and 2B illustrate cross-sectional views of a portion of an example electronic device having a housing with an adaptive surface before and after expansion of the adaptive surface in accordance with various aspects of the subject technology.

FIGS. 2A and 2B show cross-sectional views of a portion of device 100 that includes an adaptive portion 108 of adaptive surface 120 of housing 106. As shown in FIG. 2A, an internal electronic component 200 may be mounted within housing 106 (e.g., enclosed within an enclosure formed by housing 106 and a display (not shown) mounted on a front surface of the housing. Component 200 may be a printed circuit board (e.g., a main logic board), a microprocessor such as a central processing unit, another microprocessor such as an application-specific integrated circuit (ASIC), a battery, or another electronic component. As indicated in FIG. 2B, heat 201 may be generated by component 200 during operation of component 200. The heat may cause a thermal expansion of a support structure such as a support structure 211 (e.g., a metallic bar or other high CTE material structure) that is coupled to surface 120. The thermal expansion of support structure 211 causes expansion of a portion of adaptive region 108 (e.g., in a first direction). In an adaptive region that includes a negative Poisson's ratio relief pattern, this expansion in the first direction can cause an additional expansion in another (e.g., perpendicular) direction, which can cause formation of bulges 110.

Although the example of FIG. 2B shows a support structure 211 that causes the expansion of adaptive region 108 responsive to heat 201, it should be appreciated that one or more adaptive regions 108 may be provided without a support structure 211 (e.g., adaptive regions formed from shape-memory materials that expand or contract between desired shape-memory configurations responsive to temperature changes, without the aid of a separate support structure).

As described above in connection with FIGS. 1A and 1B, device 100 (e.g., housing 106) may include multiple adaptive surfaces or multiple adaptive portions 108 of a single adaptive surface 120, each configured to deform from a first configuration to a second configuration responsive to heat generated by one or more electronic components 200 within the housing at or near that adaptive surface. In this way, adaptive thermal management for individual internal components can be provided with passive structures that respond to the temperature conditions generated by the internal components.

The thermal expansion of portion 108 of surface 120 may, in turn, cause a mechanical expansion of portion 108. As shown in FIG. 2A, in an unexpanded configuration, slits 202 corresponding to openings 112 may be compressed shut so that adaptive surface 120 forms a contiguous surface free of any openings, and openings 112 only appear when portion 108 is in an expanded configuration and slits 112 are stretched into an open configuration. Adaptive surface 120 may be formed from a shape memory material that holds the expanded configuration shown in FIG. 2B, until the temperature of the adaptive surface falls below a threshold, and then returns to the unexpanded configuration as shown in FIG. 2A, in a bi-stable manner. In other implementations, the adaptive surface can smoothly deform between the first and second configurations in connection with temperature changes at or near the surface.

In the examples of FIGS. 1A/1B and 2A/2B, adaptive surface 120 is an external surface of housing 106. However, device 100 may also, or alternatively, include internal adaptive surfaces. Internal adaptive surfaces within housing 106 may help to create or modify pathways within the housing to direct heat, airflow, and/or other substances such as liquid, as desired. For example, internal component housings or internal support structures can be formed from or include adaptive surfaces. Controlling airflow may help with thermal management for device 100 and/or can facilitate improved speaker performance, and/or wireless band tuning for improved antenna performance.

Figure 3:
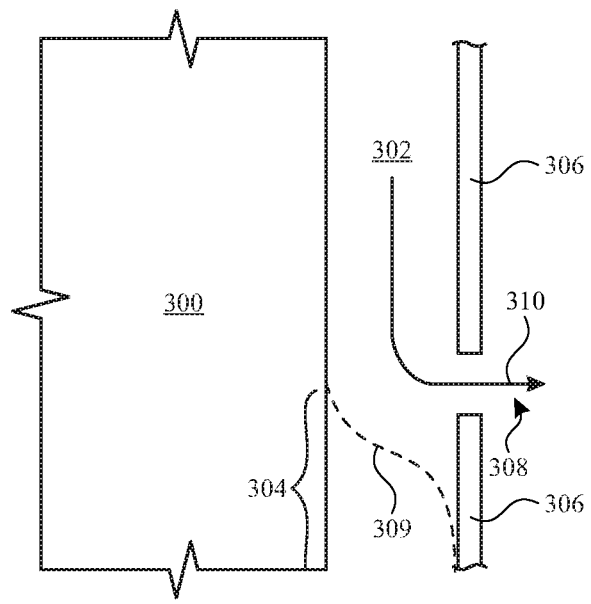
FIG. 3 illustrates a cross-sectional view of a portion of an electronic device with an internal adaptive surface in accordance with various aspects of the subject technology.

FIG. 3 shows an exemplary portion of device 100 having an adaptive internal surface. As shown in FIG. 3, a gap 302 may be formed within device 100 between an internal component 300 and a support structure such as support structure 306. Support structure 306 may be a portion of housing 106 or may be an internal wall or other internal mounting structure or support member within housing 106. Internal component 300 may be a functional component such as a battery or an integrated circuit or may be a mechanical structure such as a dividing structure, a support substrate, a shielding can, or other structural member.

In the example of FIG. 3, internal component 300 has an adaptive surface 304 that is located internal to device 100 (e.g., internal to housing 106). When adaptive portion 304 experiences a temperature change, or when adaptive portion 304 is mechanically strained, adaptive portion 304 expands to form an expanded surface 309. In the example of FIG. 3, when adaptive portion 304 expands, expanded surface 309 spans gap 302, effectively closing the gap. In this way, a flow path through gap 302 (e.g., an airflow path for thermal ventilation, acoustic enhancement, or antenna tuning, or a liquid flow path in the event of liquid ingress into housing 106) may be modified to encourage flow in a direction 310 out of an opening 308 in support structure 306 (e.g., out of an opening in housing 106). The example of FIG. 3 is merely illustrative and any of various internal surfaces within housing 106 may be adaptive to provide control and modification of open spaces and/or flow pathways within the device.

Figure 4:
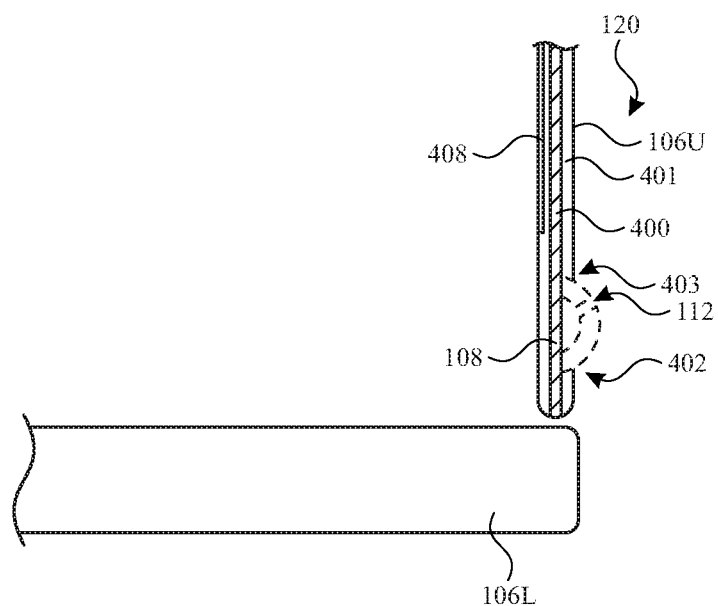
FIG. 4 illustrates a cross-sectional view of a portion of an electronic device implemented as a laptop computer with an adaptive surface in an upper housing in accordance with various aspects of the subject technology.

Referring back to FIG. 1A, upper housing 106U includes an adaptive strip 108 that runs along the base of upper housing 106U at or near the junction with lower housing 106L. FIG. 4 shows a cross-sectional view of an exemplary implementation of an adaptive strip of this type.

As shown in FIG. 4, upper housing 106U may include an internal cavity 401 within which an adaptive structure 400 is disposed. Adaptive structure 400 may be partially visible from the outside of housing 106 through an opening 403 in the housing. In an unexpanded state, adaptive structure 400 extends across opening 403 in a direction that is substantially parallel to the outer surface of housing 106 surrounding opening 403. However, responsive to a temperature changes and/or mechanical strain, a portion 402 of adaptive structure 400 expands through opening 403, thereby creating additional space within upper housing 106U, increasing the effective surface area of the outer surface of housing 106U, moving a portion of the outer surface of housing 106U outward into contact with the surrounding air, and/or creating openings such as opening 112 to allow airflow into and/or out of housing 106U. Any or all of these effects of the expansion of portion 402 may help thermally sink heat from a component within upper housing 106U (e.g., display 408 mounted on the front surface of housing 106U) to the external environment and/or change airflow pathways within upper housing 106U.

Adaptive structure 400 may be formed from a sheet of material (e.g., a polymer, metal, alloy, or other suitable material) having a negative Poisson's ratio relief pattern formed therein or having multiple different coefficients of thermal expansion, to cause the expansion and deformation of portion 402 as described and shown in connection with FIG. 4. In some implementations, adaptive structure 400 may be formed from a shape memory material in which the planar configuration and the expanded/deformed configuration shown in FIG. 4 are bi-stable configurations each associated with a temperature range.

Although examples are described herein in which adaptive surfaces are used for thermal management for electronic devices, other applications are contemplated. For example, a bi-stable adaptive surface may be deformable to form a stand or support member for a device (e.g., to prop up a mobile phone or tablet computer for watching video).

Figures 5A, 5B:
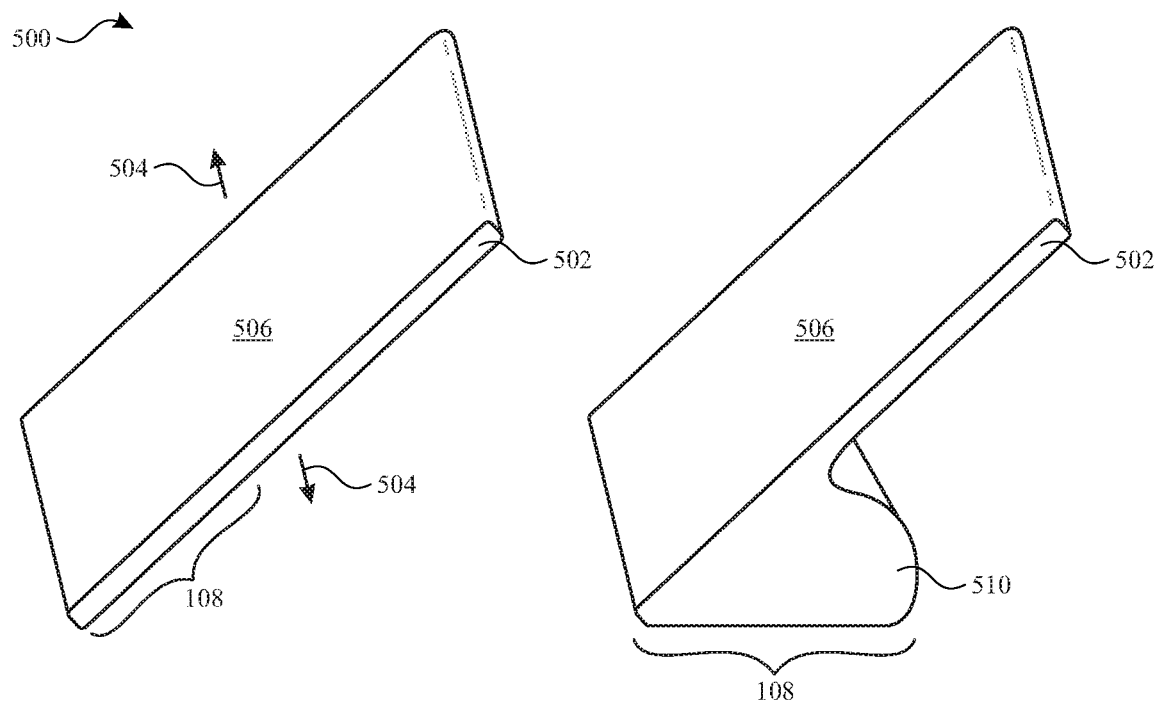
FIGS. 5A and 5B illustrate perspective views of an example device having an adaptive surface configured to form a stand for the device in accordance with various aspects of the subject technology.

FIGS. 5A and 5B show an example of a device 500 having an adaptive housing that is deformable to form a stand. As shown in FIG. 5A, device 500 may have a main structure 502 with a front surface 506 and may have an adaptive portion 108. The shape of adaptive portion 108 may be changed to form stand 510 by placing a mechanical strain on one or more portions of structure 502 (e.g., by pulling or pressing apart a portion of structure 502 as indicated by arrows 504). As shown in FIG. 5B, the deformation of portion 108 may include expansion of portion 108 in a direction that is different from the direction of the mechanical strain placed on structure 502. A negative Poisson's ratio relief pattern or an inhomogeneous arrangement of materials may cause the expansion in directions other than the direction of applied strain. The expansion caused by, for example, the negative Poisson's ratio relief pattern or the inhomogeneous arrangement of materials causes the effective surface area of adaptive region 108 to increase in the transition from the arrangement of FIG. 5A to the arrangement of FIG. 5B. The increase in effective surface area can be caused by an increase in actual surface area (e.g., by a stretching and/or thinning of the material of portion 108 during the expansion) or by an increase in the area of openings in portions of portion 108 during the expansion.

As with the other examples described herein, portion 108 may be formed from a shape memory material (e.g., a shape memory polymer or a shape memory metal alloy such as nickel titanium) such that the configurations of FIGS. 5A and 5B are bi-stable configurations for portion 108. Tri-stable or other multi-stable configurations are also contemplated for portion 108.

Device 500 may be an electronic device such as an implementation of device 100 (e.g., implemented as a mobile phone or a tablet computer). In this example, front surface 506 is a display (e.g., an LCD or OLED display) and structure 502 is an implementation of housing 106 in a configuration in which the housing is deformable to form stand 510 (e.g., for watching a movie or otherwise viewing displayed content while device 100 is resting on a surface).

In another implementation, device 500 is a mechanical device such as a soft or rigid cover for a device such as device 100 (e.g., implemented as a mobile phone, a tablet computer, or a portable computer as shown in the examples of FIGS. 1A and 1B). In this example, front surface 506 may include a recess in which an electronic device can be mounted or a transparent material through which an electronic device enclosed within structure 502 can be viewed.

Figures 6A, 6B:
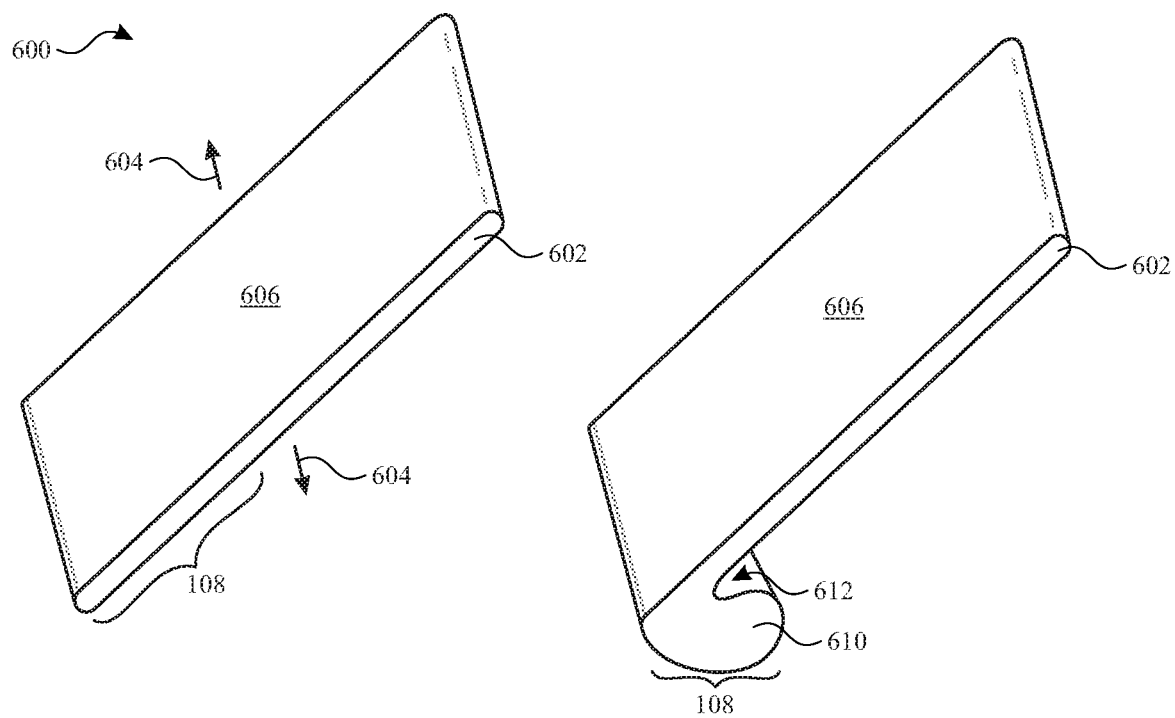
FIGS. 6A and 6B illustrate perspective views of an example device having an adaptive surface configured to form a handle for the device in accordance with various aspects of the subject technology.

FIGS. 6A and 6B show an example of a device 600 having an adaptive housing that is deformable to form a handle. As shown in FIG. 6A, device 600 may have a main structure 602 with a front surface 606 and may have an adaptive portion 108. The shape of adaptive portion 108 may be changed to form handle 610 by placing a mechanical strain on one or more portions of structure 602 (e.g., by pulling or pressing apart a portion of structure 602 as indicated by arrows 604). As shown in FIG. 6B, the deformation of portion 108 may include expansion of portion 108 in a direction that is different from the direction of the mechanical strain placed on structure 602. A negative Poisson's ratio relief pattern or an inhomogeneous arrangement of materials may cause the expansion in directions other than the direction of applied strain. The expansion caused by, for example, the negative Poisson's ratio relief pattern or the inhomogeneous arrangement of materials causes the effective surface area portion 108 to increase in the transition from the arrangement of FIG. 6A to the arrangement of FIG. 6B to form the handle. The increase in effective surface area can be caused by an increase in actual surface area (e.g., by a stretching and/or thinning of the material of portion 108 during the expansion) or by an increase in the area of openings in portions of portion 108 during the expansion.

Device 600 may be an electronic device such as an implementation of device 100 (e.g., implemented as a mobile phone or a tablet computer). In this example, front surface 606 is a display (e.g., an LCD or OLED display) and structure 602 is an implementation of housing 106 in a configuration in which the housing is deformable to form handle 610 (e.g., including a finger hold recess 612). In this example, the handle for carrying device 100 is formed from a deformation of the housing of the device itself.

In another implementation, device 600 is a mechanical device such as a soft or rigid cover or case for a device such as device 100 (e.g., a device 100 implemented as a mobile phone, a tablet computer, or a portable computer as shown in the examples of FIGS. 1A and 1B). In this example, device 600 is a carrying case for a device such as device 100 that can assume a relatively thin profile (e.g., for stacking the device or storing in a bag or backpack) and a second profile having a handle for easy carrying.

As with the other examples described herein, portion 108 may be formed from a shape memory material (e.g., a shape memory polymer or a shape memory metal alloy such as nickel titanium) such that the configurations of FIGS. 6A and 6B are bi-stable configurations for portion 108. Tri-stable or other multi-stable configurations are also contemplated for portion 108. For example, device 600 may be the same device as device 500 such that the device includes three tri-stable configurations including the configuration of FIGS. 5A and 6A, the configuration of FIG. 5B, and the configuration of FIG. 6B. Different mechanical strains on structure 502/602 can generate the different deformations to transform the device between the three (in this example) configurations.

In the examples of FIGS. 5A, 5B, 6A, and 6B, configurations of mechanical devices 500 and 600 with adaptive surfaces for forming, for example, stands or handles are described. It should also be appreciated that adaptive surfaces for thermal management of an electronic device can also be formed in a mechanical device such as one of devices 500 or 600. For example, device 500 may be a protective case for a mobile phone or a tablet computer that includes one or more adaptive surfaces for thermal management for the mobile phone or tablet computer. For example, when heat generated by the mobile phone or tablet computer reaches an adaptive surface of device 500 (e.g., via conduction through the device housing or via an opening in the device housing) the adaptive surface of the protective cover may expand, bulge, and/or form openings (e.g., as described above in connection with adaptive regions 108 of FIG. 1) to redirect and/or guide the heat from the electronic device to the external environment.

Figure 7:
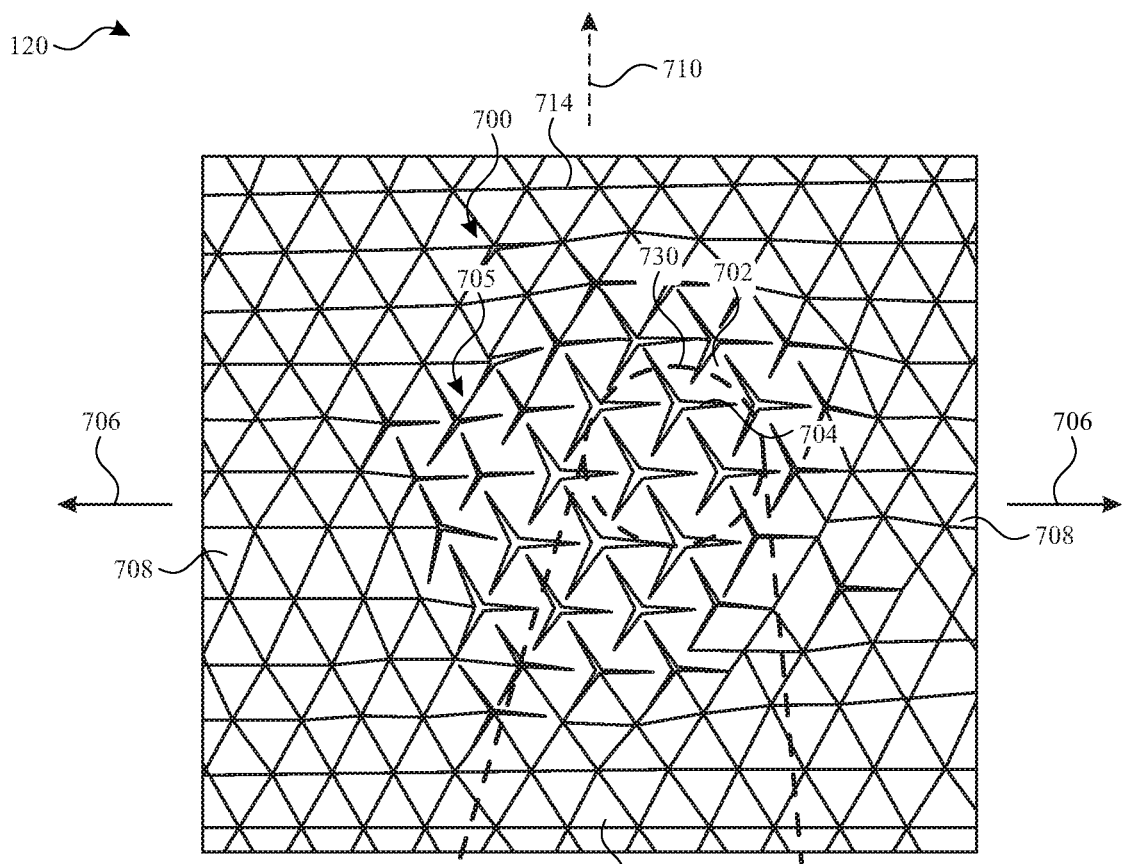
FIG. 7 illustrates a face-on view of a portion of an adaptive surface for a device that is formed from a negative Poisson's ratio relief pattern in the surface in accordance with various aspects of the subject technology.

As discussed herein, an adaptive surface 120 may be formed from a sheet of material having a negative Poisson's ratio relief pattern therein. FIG. 7 shows an adaptive surface 120 of an electronic device housing (e.g., housing 106). As shown, a pattern 700 such as a negative Poisson's ratio relief pattern can be formed in the adaptive surface. Pattern 700 includes openings 704 between interconnected panels 702. Because pattern 700 is a negative Poisson's ratio relief pattern, an expansion of surface 120, in a direction as indicated by arrows 706, causes a mechanical expansion of surface 120 in at least a perpendicular direction as indicated by arrows 710. Surface 120 may be configured to expand in the direction indicated by arrows 706 responsive to a temperature change and/or by mechanical actuation of portions 708 of the surface (e.g., mechanical actuation by an actuatable device controlled by a processor or mechanical actuation by a high CTE support structure coupled to surface 120 that thermally expands in the directions indicated by arrows 706 and pulls surface 120 in the same directions).

In some implementations, the heat can cause an indirect mechanical expansion of the adaptive surface. For example, the heat can cause a support structure (see, e.g., support structure 211 of FIG. 2B) for adaptive surface 120 to thermally expand, which, by a coupling between the support structure and surface 120 then mechanically causes adaptive surface 120 to expand in directions 706.

In another example, a heat sensor can trigger an actuatable device to expand the adaptive surface in directions 706. As with direct thermal expansions of the adaptive surface, expansion of the adaptive surface in the directions 706 can cause a deformation in at least a second direction such as directions 710. These deformations of the adaptive surface may help manage and/or direct the heat from the processor to a desired location within the device and/or out of the device housing.

In the example of FIG. 7, portions 712 and 714 of surface 120 are fixed such that the expansion of surface 120 in the direction indicated by arrows 710 causes a bulge 705 to form in a formerly flat (or conformally curved with the surrounding surface) portion of surface 120.

Surface 120 may have another configuration in which the surface is flat and openings 704 are pressed shut. In this way, openings 704 in a device housing may be adaptively formed when heat is generated, to allow that heat to escape.

Surface 120 may be formed from shape memory material (e.g., nickel titanium) such as a bi-stable material that holds the configuration of FIG. 7 when the surface is at a first temperature and returns to a flat configuration (in which openings 704 are pressed shut) at a second, lower temperature. In other configurations, surface 120 may smoothly transition from a flat surface to the bulged surface of FIG. 7 with smooth changes in temperature. Bulge 705 may be an implementation of one of bulges 110 of FIG. 1, for example.

Figure 8:
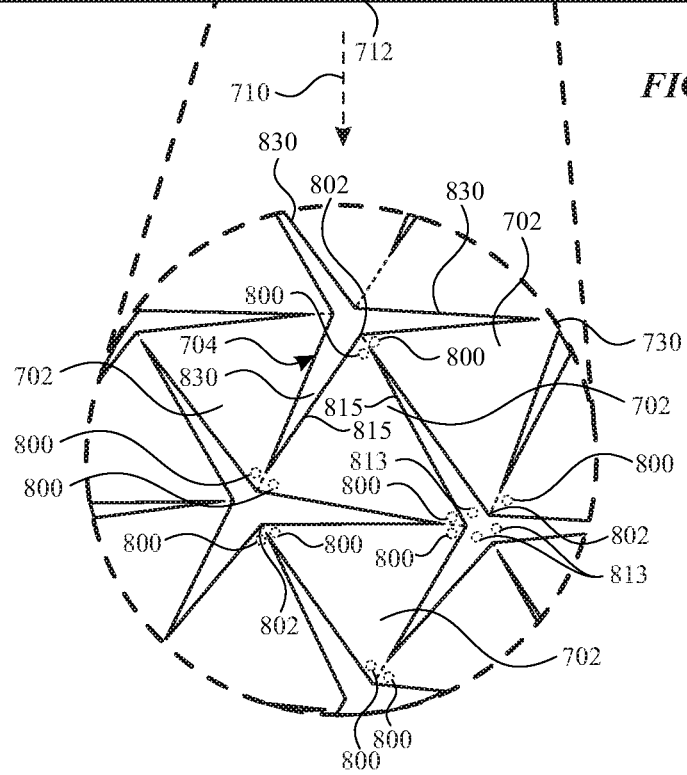
FIG. 8 illustrates a closer view of the portion of the adaptive surface of FIG. 7 in accordance with various aspects of the subject technology.

The negative Poisson's ratio relief pattern 700 of FIG. 7 includes interconnected triangular panels, which are shown in greater detail in FIG. 8. In particular, region 730 of FIG. 7 is shown in a zoomed-in view in FIG. 8.

As shown in FIG. 8, each panel 702 has a triangular shape in which each of three corner regions 800 of the panel is connected to a corresponding corner region 800 of a single other triangular panel 702 at or near a common tip 802 for the connected panels. Accordingly, each triangular panel 702 is connected to three other triangular panels at three common tips 802. As shown in FIG. 8, each triangular panel 702 includes three sides 815 that are each separated by a gap from an adjacent side 815 of an opposing triangular panel. FIG. 8 also shows that, in the expanded (e.g., bulged) configuration illustrated in FIGS. 7 and 8, openings 704 have formed by the expansion of gaps between adjacent sides of opposing ones of the triangular panels 702, such that each opening 704 includes three triangular wings 830. Triangular wings 830 of each opening 704 each includes a base 813 that meets with the bases 813 of the other triangular wings of that opening 704 at a location between three common tips 802 (i.e., formed by six triangular panels 702).

The triangular-paneled negative Poisson's ratio relief pattern of FIGS. 7 and 8 is one suitable example of a negative Poisson's ratio relief pattern that can be used to form an adaptive surface for a device such as one of devices 100, 500, or 600 as described herein. However, other negative Poisson's ratio relief patterns can also, or alternatively, be used to form an adaptive surface for a device such as one of devices 100, 500, or 600.

Figure 9:
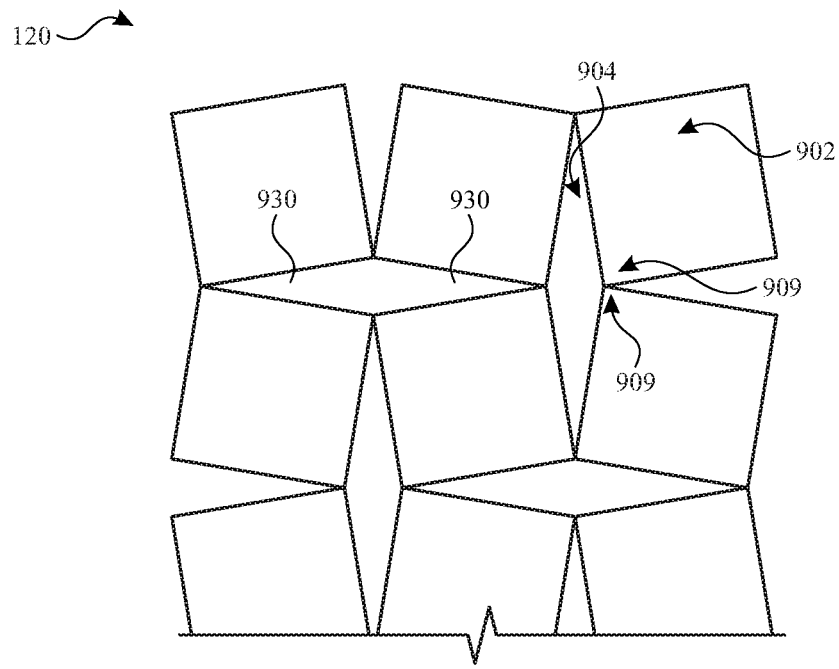
FIG. 9 illustrates a face-on view of a portion of an adaptive surface for a device that is formed from another negative Poisson's ratio relief pattern in the surface in accordance with various aspects of the subject technology.

For example, FIG. 9 shows an example of an adaptive surface 120 formed from a negative Poisson's ratio relief pattern having rectangular panels 902. Each panel 902 has a rectangular (e.g., square) shape in which each of four corners 909 of the panel is connected to a corresponding corner 909 of a single other rectangular panel 902. Accordingly, each rectangular panel 902 is connected to four other rectangular panels at four common corners. FIG. 9 also shows that, in the expanded (e.g., bulged) configuration shown, openings 904 that have formed between the sides of the rectangular patterns each include two triangular wings 930. Triangular wings 930 of each opening 904 each includes a base that meets with the base of the other triangular wing of that opening 904 at a location between four common corners, formed by four rectangular panels 902.

Figure 10:
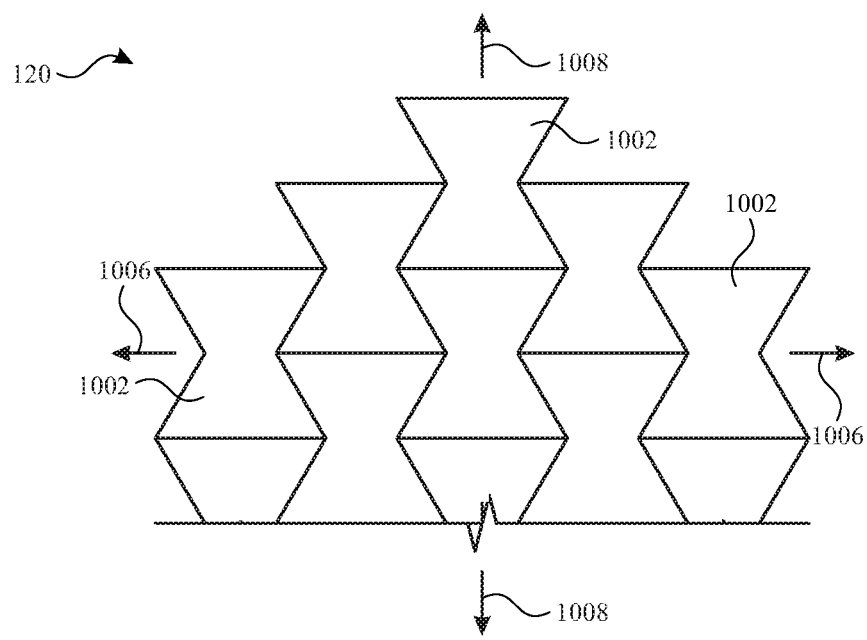
FIG. 10 illustrates a face-on view of a portion of an adaptive surface for a device that is formed from yet another negative Poisson's ratio relief pattern in the surface in accordance with various aspects of the subject technology.

FIG. 10 shows another example of an adaptive surface 120 formed from a negative Poisson's ratio relief pattern. In the example of FIG. 10, adaptive surface 120 includes hourglass-shaped openings 1002 bounded by a web-like mesh. In this arrangement, a stretch or strain in directions 1008 causes an expansion of surface 120 in directions 1006, such as an expansion that deforms the hourglass-shaped openings 1002 to form rectangular openings (e.g., in a fully open configuration). This arrangement may be particularly useful in applications such as the applications of FIGS. 5 and 6 in which shape changes are desired, but opening and closing (e.g., for thermal management) of the surface may be of less importance. However, it should also be appreciated that openings 1002 may be spanned by a material such as a resilient and/or porous material that allows (or increases) airflow therethrough when stretched by the described expansion of openings 1002.

In the examples of FIGS. 7-10, the panels and the openings of the pattern are shown as having a common size across the adaptive surface. However, it should be appreciated that pattern size (e.g., the sizes of the panels and/or the openings) can vary across the adaptive surface. Providing an adaptive surface with a negative Poisson's ratio relief pattern that varies in size across the adaptive surface can cause different opening areas to be exhibited in different areas of the surface in a common stress state for the surface.

Although the examples of FIGS. 7-10 describe adaptive surfaces that are formed from negative Poisson's ratio relief patterns, other adaptive surfaces are contemplated. For example, surfaces formed from materials having spatially inhomogeneous material arrangements (e.g., materials with inhomogeneous coefficients of thermal expansion (CTEs)) can also be formed to cause adaptive deformation responsive to the application of heat. The inhomogeneous materials can be regions of differing materials or regions of differing thickness (e.g., formed from the same material).

Figure 11:
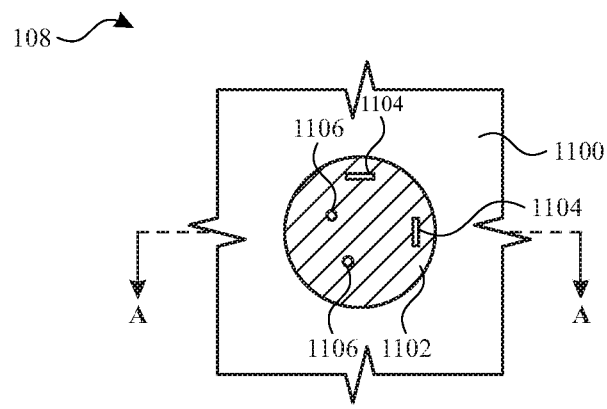
FIG. 11 illustrates a face-on view of a portion of an adaptive surface for a device that is formed from materials having different coefficients of thermal expansion in accordance with various aspects of the subject technology.

FIG. 11 shows an example of an adaptive region 108 as described herein, implemented using an inhomogeneous distribution of materials. In the example of FIG. 11, adaptive region 108 is formed from a first material 1102 having a first CTE and a second material 1100 having a second CTE. The CTE of material 1102 is larger than the CTE of material 1100 so that, because material 1102 is spatially constrained by the surrounding material 1100, material 1102 expands outward of surface 108 to form a bulge such as one of bulges 110 of FIG. 1B. As shown in FIG. 11, material 1102 may include one or more linear slits 1104 or other openings 1106 that, though pressed shut in the unexpanded configuration of FIG. 11, form openings in material 1102, when that material expands.

Figure 12:
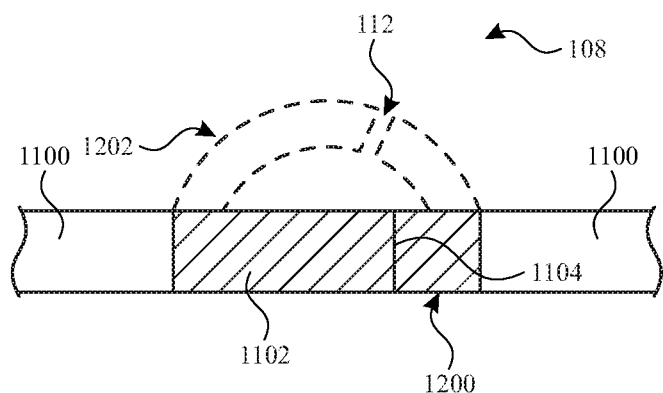
FIG. 12 illustrates a cross-sectional view of a portion of an adaptive surface for a device that is formed from multiple materials having different coefficients of thermal expansion in accordance with various aspects of the subject technology.

FIG. 12 shows a cross-sectional side view of an exemplary implementation of adaptive region 108 of FIG. 11, taken along line A-A. In the example of FIG. 12, materials 1100 and 1102 have a common cross-sectional thickness and, because material 1102 has a higher CTE than material 1100, material 1102 expands from a flat configuration 1200 to a curved or bulged configuration 1202 when exposed to heat (e.g., heat generated by a component such as component 200 of FIG. 2). As shown, a slit 1104 formed in material 1102, which is compressed shut in the configuration of FIG. 11 and the flat configuration 1200 of FIG. 12, becomes an opening 112 in the expanded configuration 1202.

Figure 13:
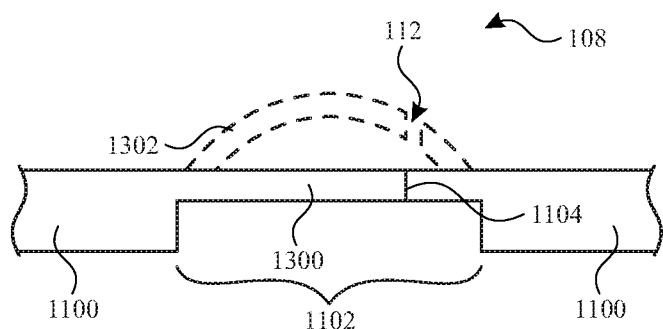
FIG. 13 illustrates a cross-sectional view of a portion of an adaptive surface for a device that is formed from materials having different coefficients of thermal expansion in accordance with various aspects of the subject technology.

The example of FIG. 12 shows an inhomogeneous arrangement of materials for adaptive region 108 that includes two different materials having two different CTEs. However, as shown in the example of FIG. 13, material 1102 may be formed from a relatively thin region of the same material 1100. The relative thinness of portion 1102 increases the rate at which portion 1102 changes in temperate relative to the surrounding thicker portions, which can allow the relatively thin portion to expand and/or bulge from a flat configuration 1300 to an expanded or bulged configuration 1302 responsive to heating (e.g., from a component such as component 200 of FIG. 2).

Figure 14:
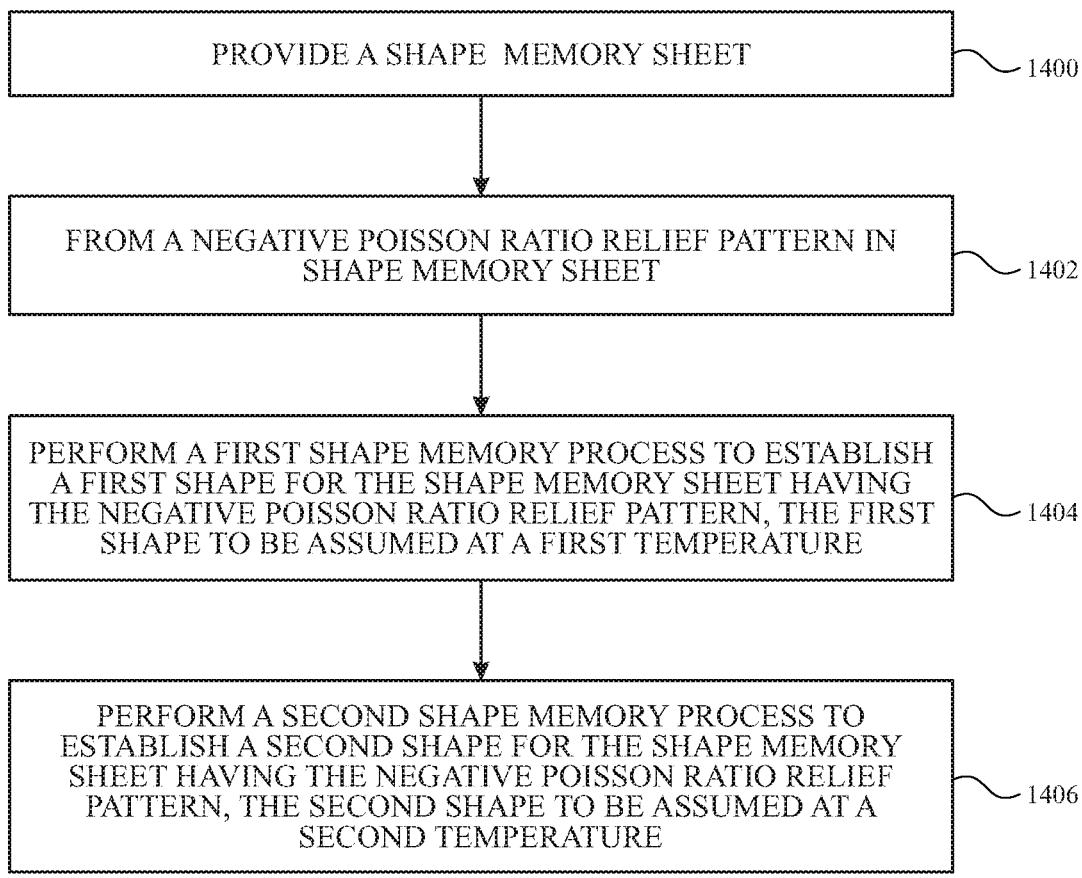
FIG. 14 illustrates a flow chart of an example process for forming an adaptive surface in accordance with various aspects of the subject technology.

FIG. 14 depicts a flow diagram of an example process for forming an adaptive surface for a device such as an electronic device, according to aspects of the subject technology. For explanatory purposes, the example process of FIG. 14 is described herein with reference to the components of FIGS. 1-13. Further for explanatory purposes, the blocks of the example process of FIG. 14 are described herein as occurring in series, or linearly. However, multiple blocks of the example process of FIG. 14 may occur in parallel. In addition, the blocks of the example process of FIG. 14 need not be performed in the order shown and/or one or more of the blocks of the example process of FIG. 14 need not be performed.

In the depicted example flow diagram, at block 1400, a sheet of material such as a shape memory sheet may be provided. For example, a shape memory sheet may be a sheet of nickel titanium or another shape memory polymer or shape memory metal.

At block 1402, a negative Poisson's ratio relief pattern such as one of the patterns described above in connection with FIGS. 7-10 may be formed in the sheet of material (e.g., the shape memory sheet). The relief pattern may be cut, etched, carved, or otherwise formed in the sheet.

At block 1404, in the example of a shape memory sheet, a first shape memory programming process is performed to establish a first shape for the shape memory sheet having the negative Poisson's ratio relief pattern. Upon programing, the first shape may be assumed by the shape memory sheet having the negative Poisson's ratio relief pattern, for example, at a first temperature. The first shape memory programming process may be a thermal or mechanical cycling processes that sets the first shape as the shape of the shape memory sheet having the negative Poisson's ratio relief pattern when the shape memory sheet having the negative Poisson's ratio relief pattern is at the first temperature (or in a first temperature range). However, it should be appreciated that other shape memory programming processes (e.g., chemical, light-based, electrical, etc.) can be used to form a shape memory sheet having a negative Poisson's ratio relief pattern that can be stimulated to change from the first shape to a second shape by application of light (e.g., infrared light or ultraviolet light) or electricity instead of (or in addition to) heat, as would be understood by one skilled in the art.

At block 1406, in the example of a shape memory sheet, a second shape memory programming process may be performed to establish a second shape for the shape memory sheet having the negative Poisson's ratio relief pattern. Upon programming, the second shape may be assumed, for example, at a second temperature. The second shape memory programming process may be a thermal or mechanical cycling process that sets the second shape as the shape of the shape memory sheet having the negative Poisson's ratio relief pattern when the shape memory sheet having the negative Poisson's ratio relief pattern is at the second temperature (or in a second temperature range). However, it should be appreciated that other second shape memory programming processes (e.g., chemical, light-based, electrical, etc.) can be used to form a shape memory sheet having a negative Poisson's ratio relief pattern and that can be stimulated to change from the first shape to the second shape by application of light (e.g., infrared light or ultraviolet light) or electricity instead of (or in addition to) heat, as would be understood by one skilled in the art. Once the first and second shapes (and/or one or more additional shapes) have been programmed into the shape memory sheet having the negative Poisson's ratio relief pattern, the first shape and the second shape may correspond to the shapes of adaptive regions 108 shown in FIGS. 1A and 1B, FIGS. 2A and 2B, FIG. 3, FIG. 4, FIGS. 5A and 5B, FIGS. 6A and 6B, FIG. 12, and/or FIG. 13 (as examples).

In accordance with various aspects of the subject disclosure, an electronic device is provided that includes a structure having an adaptive surface. The adaptive surface is configured to deform from a first configuration to a second configuration responsive to heat generated by an electronic component of the electronic device.

In accordance with other aspects of the subject disclosure an electronic device is provided that includes a structure having an adaptive surface. The adaptive surface is configured to deform from a first configuration to a second configuration responsive to an applied thermal or mechanical strain. The adaptive surface includes a negative Poisson's ratio relief pattern formed by a plurality of interconnected triangular panels, each triangular panel having three tips. Each of the three tips of each triangular panel is connected to a corresponding tip of one other triangular panel such that each triangular panel is connected to three other triangular panels. Each triangular panel includes three sides that are separated from the sides of any other triangular panel.

In accordance with other aspects of the subject disclosure, a cover for an electronic device is provided, the cover including a main structure having at least one adaptive region. The at least one adaptive region includes a shape memory material formed in a negative Poisson's ratio relief pattern. The negative Poisson's ratio relief pattern is configured to cause a mechanical stretch of the adaptive region in a first direction to expand the adaptive region in at least a second direction to deform the shape memory material from a first shape memory configuration to a second shape memory configuration.

Programmable processors and computers can be included in or packaged as electronic devices such as mobile devices. Devices can include programmable processors and programmable logic circuitry. General and special purpose computing devices and storage devices can be interconnected through communication networks.

Some devices include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations such as operations for identifying temperature changes and actuating or otherwise modifying adaptive surfaces of a device. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An electronic device, comprising:
   a housing;
   an electronic component within the housing;
   a support structure expandable in a first direction in response to heat generated by the electronic component;
   an adaptive surface coupled to the support structure at multiple locations, the adaptive surface configured to deform in a second direction from a first configuration, in which the adaptive surface abuts the support structure along a region of the adaptive surface between the multiple locations, to a second configuration in response to expansion of the support structure, the second direction being away from the support structure such that the region of the adaptive surface moves away from the support structure.

2. The electronic device of claim 1, wherein the adaptive surface comprises a negative Poisson's ratio relief pattern.

3. The electronic device of claim 2, wherein a deformation of the adaptive surface from the first configuration to the second configuration creates openings in the negative Poisson's ratio relief pattern that allow airflow through the housing.

4. The electronic device of claim 2, wherein the negative Poisson's ratio relief pattern is configured to cause a first mechanical expansion of the adaptive surface in at least a first direction, responsive to a second mechanical expansion of the adaptive surface in a second direction, the second mechanical expansion associated with the heat generated by the electronic component.

5. The electronic device of claim 4, wherein a portion of the housing adjacent to the adaptive surface is fixed to cause the adaptive surface to bulge responsive to the first and second mechanical expansions.

6. The electronic device of claim 2, wherein the negative Poisson's ratio relief pattern is formed in a bi-stable shape memory material.

7. The electronic device of claim 1, wherein the adaptive surface comprises a first portion having a first coefficient of thermal expansion and a second portion having a second coefficient of thermal expansion.

8. The electronic device of claim 1, wherein the housing comprises a plurality of adaptive surfaces each configured to deform from a first configuration to a second configuration responsive to heat generated by one or more electronic components within the housing at or near that adaptive surface.

9. An electronic device, comprising:
   a structure having an adaptive surface, the adaptive surface configured to deform from a first configuration to a second configuration responsive to an applied thermal or mechanical strain, wherein the adaptive surface includes a negative Poisson's ratio relief pattern formed by:
      a plurality of interconnected triangular panels, each triangular panel having three corner regions each adjacent to a corresponding tip of that triangular panel,
      wherein each of the three corner regions of each triangular panel is connected to a corresponding corner region of one other triangular panel such that each triangular panel is connected to three other triangular panels,
      wherein each triangular panel includes three sides that are each separated by a gap from an adjacent side of an opposing triangular panel,
      wherein a deformation of the adaptive surface from the first configuration to the second configuration causes adjacent sides of opposing triangular panels to further separate and thereby expand the gap between the adjacent sides, and wherein the expansion of the gaps creates openings that each include three triangular wings.

10. The electronic device of claim 9, wherein each of the triangular wings includes a base, wherein the bases of the triangular wings of each of the openings are adjacent to each other and disposed between three common corner regions corresponding to six triangular panels.

11. The electronic device of claim 9, wherein the structure comprises a housing, wherein the electronic device further comprises an electronic component within the housing and a support structure for the adaptive surface and, wherein the applied thermal strain corresponds to heat generated by the electronic component that causes the support structure to expand and pull on at least a portion of the adaptive surface during the expansion.

12. The electronic device of claim 11, wherein a portion of the adaptive surface is fixed so that the adaptive surface, in the second configuration, comprises a bulge on an outer surface the housing.

13. The electronic device of claim 9, wherein the structure comprises an internal structure disposed within a housing of the electronic device.

14. A cover for an electronic device, the cover comprising:
a main structure having at least one adaptive region, the at least one adaptive region comprising:
a shape memory material formed in a negative Poisson's ratio relief pattern, wherein the negative Poisson's ratio relief pattern is configured to cause a stretch of the adaptive region in a first direction to expand the adaptive region in at least a second direction to deform the shape memory material from a first shape memory configuration to a second shape memory configuration, wherein the first shape memory configuration is a substantially flat configuration and the second shape memory configuration forms a stand for the electronic device.

15. The cover of claim 14, wherein deformation of the shape memory material increases an effective surface area of the adaptive region.

16. The cover of claim 14, wherein the shape memory material is configured to deform from the first shape memory configuration to the second shape memory configuration responsive to heat generated by the electronic device.

17. A cover for an electronic device, the cover comprising:
a main structure having at least one adaptive region, the at least one adaptive region comprising:
a shape memory material formed in a negative Poisson's ratio relief pattern, wherein the negative Poisson's ratio relief pattern is configured to cause a stretch of the adaptive region in a first direction to expand the adaptive region in at least a second direction to deform the shape memory material from a first shape memory configuration to a second shape memory configuration, wherein the first shape memory configuration is a substantially flat configuration and the second shape memory configuration forms a handle for carrying the electronic device.

18. The cover of claim 17, wherein deformation of the shape memory material increases an effective surface area of the adaptive region.

19. The cover of claim 17, wherein the shape memory material is configured to deform from the first shape memory configuration to the second shape memory configuration responsive to heat generated by the electronic device.

* * * * *

UNITED STATES PATENT AND TRADEMARK OFFICE
CERTIFICATE OF CORRECTION

PATENT NO. : 10,681,843 B2
APPLICATION NO. : 16/027152
DATED : June 9, 2020
INVENTOR(S) : Sabrina K. Paseman et al.

Page 1 of 1

It is certified that error appears in the above-identified patent and that said Letters Patent is hereby corrected as shown below:

In the Claims

Column 15, Line 22 (Claim 12) "surface the housing." should read --surface of the housing--.

Signed and Sealed this
Eleventh Day of August, 2020

Andrei Iancu
*Director of the United States Patent and Trademark Office*